US006611947B1

(12) United States Patent
Higgins et al.

(10) Patent No.: US 6,611,947 B1
(45) Date of Patent: Aug. 26, 2003

(54) METHOD FOR DETERMINING THE FUNCTIONAL EQUIVALENCE BETWEEN TWO CIRCUIT MODELS IN A DISTRIBUTED COMPUTING ENVIRONMENT

(75) Inventors: Joseph E. Higgins, Albany, CA (US); Vigyan Singhal, Fremont, CA (US); Adnan Aziz, Austin, TX (US)

(73) Assignee: Jasper Design Automation, Inc., Mountain View, CA (US)

(*) Notice: Subject to any disclaimer, the term of this patent is extended or adjusted under 35 U.S.C. 154(b) by 366 days.

(21) Appl. No.: 09/644,767

(22) Filed: Aug. 23, 2000

(51) Int. Cl.$^7$ .............................................. G06F 17/50
(52) U.S. Cl. ..................... 716/5; 716/1; 716/4; 716/5; 716/7; 716/11; 716/17; 712/1; 703/14; 703/28; 702/109; 702/123
(58) Field of Search ................. 716/1, 21; 702/109, 702/123; 703/14, 28; 712/1; 714/726, 732

(56) References Cited

U.S. PATENT DOCUMENTS

| | | | |
|---|---|---|---|
| 5,243,538 A | 9/1993 | Okuzawa et al. | 364/489 |
| 5,638,381 A | 6/1997 | Cho et al. | 371/22.4 |
| 5,754,454 A * | 5/1998 | Pixley et al. | 702/123 |
| 5,949,691 A | 9/1999 | Kurosaka et al. | 364/489 |
| 6,321,173 B1 * | 11/2001 | Foster | 702/109 |

OTHER PUBLICATIONS

Huang, et al., "*AQUILA: An Equivalence Checking System for Large Sequential Designs,*" Final Manuscript of Trans. On Computer SIDC–64–R2, pp. 1–36.

Eijk, Cornelis A.J. van, "*Formal Methods for the Verification of Digital Circuits,*" CIP–Data Library Technische Universiteit Eindhoven, pp. v–143, 1997.

Mukherjee, et al., "*FLOVER: Filtering Oriented Combination Verification Approach*".

Kunz, Wolfgang, "*A Novel Framework for Logic Verification in a Synthesis Environment,*" IEEE Transactions on Computer–Aided Design of Integrated Circuits and Systems, vol., 15, No. 1, Jan. 1996, pp. 20–32.

Brand, Daniel, "*Verification of Large Synthesized designs,*" Proc. Intl. Conf. On Computer–Aided Design (ICCAP), 1993, pp. 534–537.

Kuehlmann, Andreas, "*Equivalence Checking Using Cuts and Heaps,*" IBM Thomas J. Watson Research Center, Yorktown Heights, NY U.S. A.

Matsumaga, "*An Efficient Equivalence Checker for Combination Circuits,*" Fujitsu Laboratories, LTD, 33$^{rd}$ Design Automation Conference, Kawasaki 211–88, Japan.

Pradhan, et al., "*VERILAT: Verification Using Logic Augmentation and Transformations,*" ICCAD, 1996.

Burch, et al., "*Tight Integration of Combination Verification Methods,*" Cadence Berkeley Labs, Berkeley, CA.

Bryant, Randal E., "*Graph–Based Algorithms for Boolean Function Manipulation,*" IEEE Transaction on Computers, vol. C–35, No. 8, Aug. 1986, pp. 677–691.

(List continued on next page.)

Primary Examiner—Vuthe Siek
Assistant Examiner—Helen Rossoshek
(74) Attorney, Agent, or Firm—Pillsbury Winthrop LLP

(57) ABSTRACT

This invention determines whether two logic level circuit models have equivalent functionality. The method allows difficult portions of the equivalent functionality check to be partitioned and concurrently solved in a distributed computing environment. This permits the user to use, in a scalable fashion, additional computing resources to rapidly solve difficult equivalent functionality checks. The method allows difficult checks to be solved using (1) a divide-and-conquer approach, (2) by a competitive approach in which many independent attempts are made to solve the same check, or (3) by allocating more resources to solve the difficult check.

16 Claims, 8 Drawing Sheets

OTHER PUBLICATIONS

Foster, Harry, "Techniques for Higher–Performance Boolean Equivalence Verification," *The Hewlett–Packard Journal*, Article 3, 1998, pp. 30–38.

Jain, et al., "Advance Verification Techniques Based on Learning," *32nd ACM/IEEE Design Automation Conference*.

Tafertshofer, et al., *A SAT–Based Implication Engine for Efficient ATPG, Equivalence Checking, and Optimization for Netlists*, IEEE, 1997.

Kuehlmann, et al., "Error Diagnosis for Transistor–Level Verification".

Eijk, C.A.J. van, et al., "Exploiting Functional Dependencies in Finite State Machine Verification," *Design Automation Section, Eindhoven University of Technology*.

Eijk, C.A.J. van, et al., "Exploiting Structural Similarities in a BDD–based Verification Method," *Proc. 2nd Int. Conf. On Theorem Provers in Circuit Design (TPCD94)*, pp 110–125 1995 (Lecture notes in Computer Science, vol. 901, Spri.

Kuehlmann, et al.; "Error Diagnosis for Transistor–Level Verification".

H.D. Foster; "Techniques for Higher–Performance Boolean Equivalence Verification"; Hewlett–Packard, Article 3, Aug. 1998, pp. 30–38.

R.E. Bryant; "Graph–Based Algorithms for Boolean Function Manipulation"; IEEE, 1986, pp. 677–691.

Bruch, et al.; "Tight Integration of Combinational Verification Methods"; Cadence Berkeley Labs.

C.A.J. van Eijk, et al.; "Exploiting Functional Dependencies in Finite State Machine Verification".

Paul Tafertshofer, et al.; "A SAT–Based Implication Engine for Efficient ATPG, Equivalence Checking, and Optimization of Netlists"; IEEE, 1997.

Jawahar Jain, et al.; "Advanced Verification Techniques Based on Learning"; *32nd ACM/IEEE Design Automation Conference*, 1995 ACM.

Shi–Yu, et al.; "AQUILA: An Equivalence Checking System for Large Sequential Designs"; Final Manuscript of Trans. On Computer SIDC–64–R2, pp. 1–36.

Dhiraj K. Pradhan et al.; "VERILAT: Verification Using Logic Augmentation and Transformations"; IEEE, 1996 (ICCAD1996).

Matsunaga; "An Efficient Equivalence Checker for Combinational Circuits"; *33rd ACM Design Automation Conf.*

Kuehlmann et al.; "Equivalence Checking Using Cuts and Heaps"; DAC 97, Anaheim, California.

Kunz, Wolfgang; "A Novel Framework for Logic Verification in a Synthesis Environment" IEEE, vol. 15, No. 1, 1996, pp. 22–32.

Brand, Daniel, "Verification of Large Synthesis" IEEE, 1993, pp. 534–536.

Rajarshi Mukherjeee, et al.; "FLOVER: Filtering Oriented Combinational Verification Approach".

SunMicroSystems Inc.; "JavaSpaces™Specification"; 1999 pp. ii–26.

Eijk, et al.; "Formal Methods for the Verification of Digital Circuits"; Ph.D. Thesis, CIP–Data Library Technische Universiteit Endhoven, 1997, pp. v–141.

\* cited by examiner

METHOD FOR DETERMINING THE FUNCTIONAL EQUIVALENCE BETWEEN TWO CIRCUIT MODELS IN A DISTRIBUTED COMPUTING ENVIRONMENT

BACKGROUND OF THE INVENTION

1. Field of the Invention

The present invention relates to the field of hardware circuit verification, specifically to verifying identical functionality between two different logic level circuit models. In particular, it relates to a logic verification method that uses a distributed computing environment to quickly solve difficult verification problems.

2. Background of the Related Art

Recent increases in the complexity of modem integrated circuits have resulted in corresponding increases in the difficulty of verifying design correctness. Design flaws have significant economic impact both in terms of increased time-to-market and in reduced profit margins. A typical design flow has many steps, each of which can introduce design flaws. Traditionally, simulation-based techniques have been used to verify design correctness. These techniques have become less effective because of their inability to completely and quickly verify large designs. An increasing popular alternative is the use of formal mathematical techniques, employed by tools known as equivalence checkers, to verify design correctness.

A typical design flow where an integrated circuit is taken from concept to fabrication includes a number of steps. As a first step, the conceptual nature of the integrated circuit is determined. The desired functionality of a circuit is described by a set of specifications. A conceptual model of the circuit is created based on the specifications. For example, in the case of a complex microprocessor, the conceptual nature of the circuit is typically specified in a high level language such as C++. Modeling tools are available which simulate the behavior of the conceptual model under specific test cases to ensure that the model performs as expected.

Once the conceptual nature of the circuit is determined, a register transfer level (RTL) model of the digital circuit is built based upon the conceptual model and is modeled on a digital computer using an RTL modeling tool. At this stage, the design of the circuit, as modeled by the RTL modeling tool, may be used to verify that the circuit meets the desired specifications. In some cases the RTL modeling tool may allow the validity of the modeled circuit to be checked in the context of the high-level language model.

After the design of the RTL model is completed, it is transformed into a gate level model in which individual logic gates are specified and connected together to perform the same logic functions as the RTL level circuit model. The transformation process is error-prone due to both human error and tool error. To validate the transformation, the logic functions of the gate level model must be verified to be the same as the corresponding functions in the RTL model. An equivalence checking tool, such as one described in this invention, can be used to perform this verification.

The gate level model is often further transformed by optimizations that attempt to improve the performance of the circuit such as reducing the area required to construct the circuit, increasing the speed of operation of the circuit and reducing the power consumption of the circuit. Once the gate level logic of the circuit model has been optimized, the optimized gate level model operation must be verified with respect to either the RTL level model or the original gate level model.

The gate level model may go though additional transformations, each yielding successive versions of the circuit. An example of this transformation is scan logic insertion, which allows the circuit to perform in a scan mode and a normal mode. When operating in scan mode the circuit can be tested for manufacturing defects, while in normal mode the circuit should behave as before. Another example is clock tree insertion, which is the process of inserting buffers in the clock tree to improve the timing of clock signals.

At some stage the gate level circuit is placed and routed into a layout. This step may involve further transformations and local optimizations that are driven by placement and timing constraints. Each transformation necessitates the verification of functionality of the pretransformation version compared with the post-transformation version of the circuit.

Conventional equivalence checking tools can be used to verify the functional equivalence of each pre-transformation version versus the corresponding post-transformation version. The verification can be performed by comparing the post-transformation version with either the first RTL circuit model or with a previously verified pre-transformation version. Significant resources (engineering time, computer time and computer memory) are used to perform this verification. Conventional equivalence checking tools frequently fail to complete because of these resource limitations.

In conventional circuit verification, equivalence checking of two circuits is performed by (1) partitioning the two circuits into corresponding combinational subcircuit pairs that contain no storage elements, and (2) sequentially verifying the equivalence of each corresponding subcircuit pair. The circuits are partitioned at circuit inputs, outputs and storage element boundaries. The combinational subcircuit pairs are associated according to a correspondence between the circuit inputs, outputs and storage elements of the two circuits, so that the equivalence is verified for each corresponding set of subcircuits. The conventional device can create the circuit input, output and storage element correspondence with user guidance or automatically—see, e.g., U.S. Pat. No. 5,638,381 to Cho et al., U.S. Pat. No. 5,949,691 to Kurosaka et al. and Foster, "Techniques for Higher-Performance Boolean Equivalence Verification", Hewlett-Packard Journal 30–38 (August 1998).

Checking identical functionality of combinational subcircuit pairs is an inherently difficult problem. The resources used to perform the check are typically related to the structural differences of the two circuit models. Conventional equivalence checking tools often encounter combinational subcircuit pair checks that cannot be resolved with the allotted time and memory resources.

An example of this difficulty occurs when a combinational subcircuit contains a multiplier. Circuits containing multipliers are well known to be difficult from an equivalence checking perspective—see, e.g., Bryant, "Graph-Based Algorithms for Boolean Function Manipulation", IEEE Transactions on Computers, Vol. C-35, No. 8, August 1986, pp. 677–691. A standard method of addressing this shortcoming is for the user to intervene and manually partition each combinational subcircuit into two subparts. One subpart of each circuit model contains the multiplier and the other subpart the remainder of the circuit model. The multipliers are typically compared using traditional simulation based methods, while the other subparts can be compared using the conventional equivalence checking tool. The user must take care to partition the combinational subcircuits correctly, and must perform two different equivalence checks to compare the corresponding subparts. The technique of resolving difficult pair checks by splitting the combinational subcircuits into corresponding subparts can be applied to pair checks that do not involve multipliers as well.

Another method of resolving difficult pair checks is to perform case analysis. An illustrative example of a case analysis follows. First, an input to the difficult combinational subcircuit pair is chosen. Then two additional combinational subcircuit pairs are created; one in which the chosen input is assigned to the false value (0), and another in which the chosen input is assigned to the true value (1). Then each corresponding pair is compared using a conventional equivalence checking tool. The user must take care to assign the chosen inputs correctly and must perform two different equivalence checks.

Existing semiconductor design environments typically have significant distributed computing resources available. A design engineer often has convenient access to many workstations, or can access distributed computing resources through an application service provider (ASP), described in greater detail below. These additional resources could potentially be of significant use in addressing the verification problem. Conventional equivalence checking tools are unable to directly take advantage of these additional distributed resources. By manually partitioning the two circuit models into many subparts, the user can explicitly assign different subparts to each available distributed resource. The user must take care to partition the circuit models correctly, to execute each check correctly, and to correctly track and assemble the results of each of the subparts.

FIG. 1 illustrates a typical distributed computing environment, in which a collection of computing units such as workstations 110–113 can communicate and pass data to each other via a network 120–124. The network may range from a local area network to the Internet.

FIG. 2 shows the flow in a conventional system for doing equivalence checking as disclosed in the aforementioned Kurosaka et al. patent. The conventional system includes a data input section for reading descriptions of the two circuits to be compared. This system then detects corresponding inputs, outputs and storage elements in the two circuits. Following this, based on the corresponding storage elements in the two circuits, the circuits are partitioned into many smaller purely combinational portions. The system then has to check the functional equivalence of each pair of corresponding portion. Each check of functional equivalence between each pair of corresponding portions is hereinafter referred to as a pair check.

Each of the two circuits is represented in the system as a data structure composed of interconnections of elementary Boolean gates, such as AND gates, OR gates, NOT gates and the like, and storage elements such as latches and flip-flops. The elementary gates can be grouped together to form new components, which can be further used to create circuit models that are hierarchical in nature.

More specifically, having read the circuit data in the starting Step 200, the input pair, output pair and storage element pair correspondence between the two circuits is determined in Step 205. The storage elements may be flip-flops and latches, as well as tri-state elements—see the aforementioned Cho et al. and Kurosaka et al. patents and the Foster paper for a detailed description of how to determine the correspondence. This reduces the problem of equivalence checking to the problem of checking the equivalence of pairs of combinational sub-circuits. Next an unchecked pair is selected in Step 210, and the pair is checked for equivalence in Step 215. The result of the pair check is saved in Step 220. When all unchecked pairs have been examined in Step 210, the system writes out the comparison results in Step 225.

To further aid in the understanding of the prior art and the problems associated therewith, it may be helpful to provide a brief overview of distributed computing environments. As used herein, a computing environment consists of an ensemble of processing units connected by a network. The network allows the processing units to communicate by passing data between themselves. The network may range from a local onboard bus to a local area network to a very large and expansive network such as a wide area network. The computing environment also includes the various operating systems, storage media, and other processing resources which reside on these computers and that are interconnected and accessible via the network through various software products.

The rapidly dropping cost of computer workstations and communication networks has significantly increased the amount of computing resources available in the typical engineering workplace environment: However, conventional equivalence checking tools are unable to take advantage of this commonly available additional resource. To use this additional resource, the user of the conventional equivalence checking tools must first manually partition the verification problem into a number of different problems. This partitioning may involve manual copying and editing of the versions of the design models being compared. In most cases, it is practically impossible for a user to create a fine-grained partition of the verification problem, which further restricts the user's ability to use the distributed resource. Next the user must assign each partitioned problem to a different distributed computing resource. Finally, assuming that each partitioned problem was satisfactorily resolved, the user must manually combine all of the results together to determine the answer to the original verification problem. If any partitioned problem does not complete satisfactorily, the user must decide how to resolve the problem and complete the verification process. Each of these steps is time consuming, prone to human error and is an additional distraction to the user.

The Internet, coupled with the previously mentioned drop in computer and network resource costs, has resulted in the growth of ASPs. For a fee, an ASP provides access to a number of applications in an environment with a large available distributed computing resource. This enables businesses with limited financial resources to avail themselves of powerful distributed computing resources. To take advantage of the resources available from an ASP using a conventional equivalence checking tool, a user must manually perform the error prone process of partitioning, execution and recombination.

A much more desirable methodology would be to perform the process of check partitioning, distributed solution and subsequent recombination in an easy, automatic and less error-prone fashion. The present invention describes such an equivalence checking tool which automatically uses the available distributed computing resource.

SUMMARY OF THE INVENTION

The present invention relates to an equivalence checking system where checks on pairs of combinational subcircuits are performed concurrently in a distributed computing. environment. Each individual pair check is performed in a distributed computing environment by using the combinational equivalence checking portion of a known technology. Difficult pair checks can be solved by one of the following methods:

a cooperative divide-and-conquer approach which partitions a pair check into further, easier to solve, pair checks;

a competitive approach, in which a collection of equivalent pair checks replaces a difficult pair check; and allocating additional resources to solve the pair check.

The present invention eliminates the error prone user intervention, and can automatically use additional resources available in a distributed computing environment.

A check manager can determine if the verification is complete by determining if all combinational subcircuit pairs have been checked. After all pair checks have been completed, the check manager can easily determine the overall status of the verification check by examining the finished check results. The check manager determines the overall verification status to be one of the following:

the designs are equivalent;

the designs are not equivalent; and the allocated memory resources were exhausted before the designs could be proven to be equivalent or not equivalent.

If the third possibility occurs, the check manager may choose to run relevant portions of the task again with additional computing resources to attempt to complete the checking task with an equivalent or not equivalent result.

Prior verification methods combine the combinational pair check engine and all aspects of check management into a single-threaded program. In contrast, the current invention explicitly separates these elements, thus permitting verification problems to be solved in a scalable fashion. In addition, the current invention identifies additional techniques for addressing difficult pair checks that can dramatically improve performance and allow resolution of problems that had no practical solution before.

BRIEF DESCRIPTION OF THE DRAWINGS

These and other objects, features and advantages of the present invention are better understood by reading the following detailed description of the preferred embodiment, taken in conjunction with the accompanying drawings, in which.

DETAILED DESCRIPTION OF PRESENTLY PREFERRED EXEMPLARY EMBODIMENTS

Figure 1:
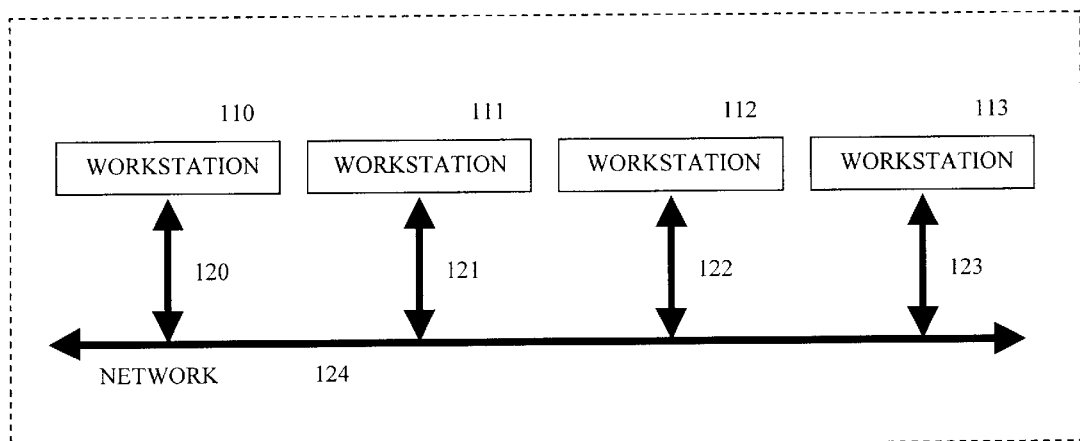
FIG. 1 illustrates, in block diagram form, a typical distributed computing environment.
Figure 2:
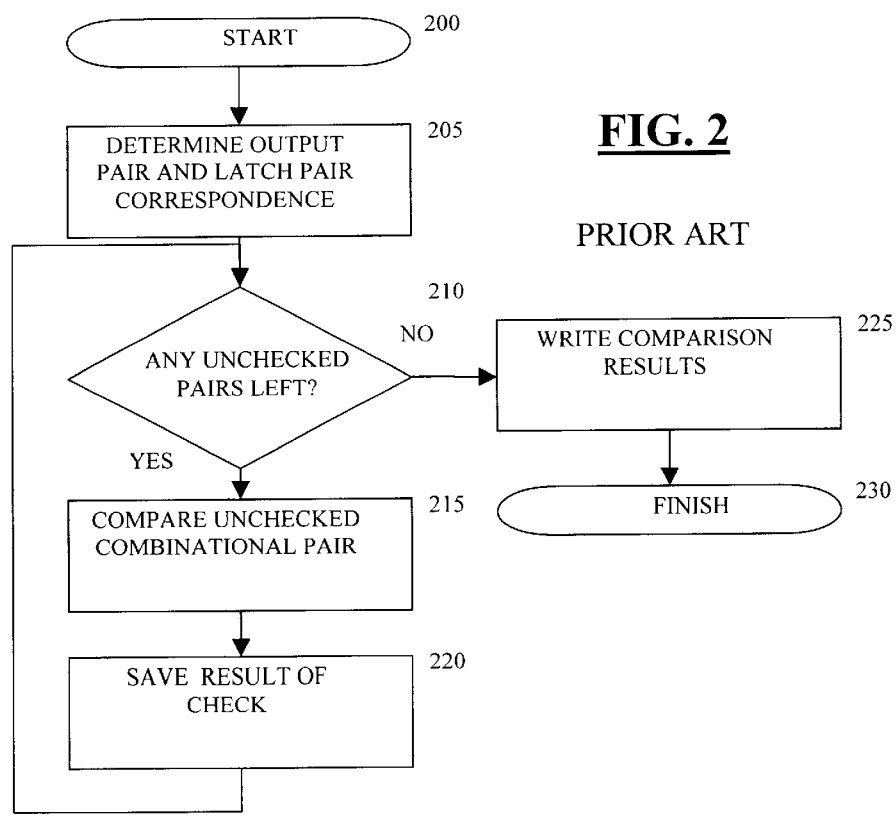
FIG. 2 illustrates, in flow diagram form, a conventional method for performing equivalence checks.

For the purposes of clarity, the following terms used herein are defined below.

The term "cone" refers to a combinational subcircuit with a single output and one or more inputs. Each input can take either a true (1) or false (0) value. The output can take either a true (1) or false (0) value depending on the values of the inputs and the function represented by the combinational subcircuit. A cone is usually identified by a name associated with the cone output.

The term "input assignment" refers to an assignment of true (1) or false (0) values to a collection of cone inputs.

The term "pair check" refers to the determination of whether a pair of cones represents the same function. The pair of cones represents the same function if the output of each cone is the same for any corresponding input assignment. The result of a pair check can be either that the cones are EQUIVALENT, NOT EQUIVALENT or INCOMPLETE. A result of EQUIVALENT or NOT EQUIVALENT indicates that the pair of functionally equivalent or not, respectively. A result of INCOMPLETE indicates that a result of EQVIVALENT or NOT EQUIVALENT could not be determined within the allocated resources (time or memory). A result of INCOMPLETE typically requires further resolution, such as allocating additional time or memory resources. Other resolutions will be described below.

The term "counterexample" refers to an input assignment that when applied as inputs to a particular pair of cones, will result in one cone computing the value true (1) and the other cone computing the value false (0). It demonstrates that the pair of cones do not represent the same logic function. When the system (check engine) determines that a pair check is not equivalent, it supplies a counterexample. The counterexample can be used to understand why the two cones do not represent the same function. A check engine may generate a counterexample using a technique well-known in the art, see, e.g., Andreas Kuehlmann et al.,"Error Diagnosis for Transistor-Level Verification", Proceedings of the Design Automation Conference, 1994.

The term "pair check descriptor" (PCD) refers to the data structure used to represent the status of a pair check. A PCD 600 (see FIG. 6) includes a description of cone pair to be checked in the form of the cone pair output names 610–620. The PCD 600 includes a description of the currently known status of the pair check 630, and may contain a description of resource limits 640 to be applied when performing the pair check (e.g., run the computation for no longer than 60 seconds). The PCD 600 contains a reference to a parent PCD 650. The parent.PCD reference 650 is used to determine if the PCD 600 is related (in a manner to be described subsequently) to another PCD referred to as the parent PCD. The parent PCD reference 650 may have a value of NONE indicating that the PCD 600 has no related parent PCD.

The term "related PCDs" refers to a collection of PCDs 600 whose parent PCD reference 650 all refer to the same parent PCD.

The term "cone database" refers to a database that contains relevant information about each cone in the two designs being compared. This data consists of a description of the combinational logic comprising each cone, including, but not limited to, the types of elementary gates and their interconnections and the names assigned to inputs and output of each cone. The database may contain additional information such as the names of storage elements and their relationship to the cone inputs and outputs. The cone database is used to centralize and share the information about the two designs being compared with applications known as check engines. Each PCD 600 contains two references 610, 620 to cones stored in the cone database.

The term "difficult pair check" refers to a pair check that is known to or likely to result in an INCOMPLETE result. If a previous attempt to resolve the pair check has returned a result of INCOMPLETE, then the pair check is known to be difficult. In certain cases, it can be determined a priori that a pair check is likely to be difficult. For example, cones containing logic that represent integer multipliers are well known to be difficult from an equivalence checking perspective—see, e.g., the aforementioned Bryant et al. paper. When the circuits are read in by the system, it can detect the presence of multipliers and mark the relevant pair check as being potentially difficult. Other techniques for determining that a pair check is likely to be difficult could be based in the number of inputs to the cones, or the number of elementary gates in the cones.

The terms "cooperative analysis" and "cooperative replacement checks" refer to the replacement of a difficult pair check by a collection of new pair checks that satisfy certain properties. The term cooperative refers to the fact that the difficult pair check will have a result of EQUIVALENT if, and only if, all of the new pair checks have a result of EQUIVALENT. All of the replacement pair checks should be less difficult that the original pair check in order for this technique to be successful. The replacement checks must satisfy the following properties to ensure that solving the replacement pair checks is indeed equivalent to solving the difficult pair check: if all new pair checks are determined to have a check status of EQUIVALENT, then the original pair check must be equivalent. Furthermore, if any of the new pair checks is determined to have a check result of NOT EQUIVALENT, then this must imply that the original pair is not equivalent. In the NOT EQUIVALENT case, it must be possible to use the counterexample provided by the check engine to determine an appropriate counterexample for the original pair. If any of the new pair checks are determined to have a check status of NOT EQUIVALENT, then there is no need to perform any remaining pair checks in the replacement collection. If any of the replacement pair checks returns a status of INCOMPLETE, then the result of the original pair check is also INCOMPLETE.

The term "case analysis" refers to a specific type of cooperative analysis. An illustrative example of a simple case analysis follows: First, an input to the difficult pair check is selected. Next, two replacement pair checks are created, one in which the selected input is assigned to false (0), and another in which the selected input is assigned to true (1). The parent PCD reference 650 of both replacement pair checks references the original pair check PCD. If both replacement pair checks have a result of EQUIVALENT, then the original pair check is equivalent. If either pair check has a result of NOT EQUIVALENT, then the counterexample for the replacement check can be extended to a counterexample for the original check by adding the selected input with the relevant true or false value. A more complex case analysis can be performed in the following manner: A new cone, referred to as the selection cone, is created which uses the inputs to the original cone pair as inputs. The function computed by the selection cone, referred to as the selection function, is arbitrary and will be discussed below. Two new pair checks are created in the following manner: The first new pair check consists of two new cones in which the original cone outputs are logically ANDed with the selection cone output. The second new pair check consists of two new cones in which the original cone outputs are logically ANDed with the logical complement of the selection cone output. If both replacement pair checks have a result of EQUIVALENT, then the original pair check is equivalent. If either pair check has a result of NOT EQUIVALENT, then the counterexample for the replacement check can be directly used as a counterexample for the original check. There are many ways to compute a selection function. If the selection function represents the value of one of the cone pair inputs, then the case analysis performed is identical to that described in the simple case analysis. Another choice for selection function would be to use the function represented by an internal node in either cone. An appropriate choice of internal node could be made when the circuits are read in by the system. One choice would be to locate a node representing the value of a condition in an if statement in the original RTL circuit description. This could be performed either with user guidance or when the system reads in the two circuits to be compared.

The terms "competitive analysis" or "competitive replacement checks" refer to the replacement of a difficult pair check by a collection of new pair checks that satisfy certain properties. The term competitive refers to the fact that the difficult pair check will have a result of EQUIVALENT if, and only if, at least one of the new pair checks have a result of EQUIVALENT. It is only necessary for one of the replacement pair checks to complete in order to determine the result of the original pair check. At least one of the replacement pair checks should be less difficult that the original pair check in order for this technique to be successful. The replacement checks must satisfy the following properties to ensure that solving the replacement pair checks is indeed equivalent to solving the difficult pair check: if any new pair check is determined to have a check status of EQUIVALENT, then the original pair must be equivalent. Contrast this with all in the case of a cooperative analysis. Furthermore, if any of the new pair checks is determined to have a check status of NOT EQUIVALENT, then this must imply that the original pair is not equivalent. In the latter case, it must be possible to use the counterexample provided by the check engine to determine an appropriate counterexample for the original pair. If any of the new pair checks are determined to have a check status of either EQUIVALENT or NOT EQUIVALENT, then there is no need to perform the remaining checks in the collection. If all (contrast with any in the case of cooperative analysis) of the replacement pair checks returns a status of INCOMPLETE, then the result of the original pair check is also INCOMPLETE.

A competitive analysis is best illustrated by considering an example in which a multiplier is identified in an RTL cone while comparing an RTL circuit model with a gate level model. The identification of a multiplier can be performed either with user guidance or when the system reads in the two circuits to be compared. As noted above, the presence of a multiplier indicates a potentially difficult check—multipliers are well known to be difficult from an equivalence checking perspective—see, e.g., the aforementioned Bryant paper. The check involving the multiplier in the RTL circuit model can be be replaced by competitive replacement checks in the following manner: First, the user provides a list of all available multiplier implementations. Next, for each available multiplier implementation a new cone is created created by copying the RTL cone containing the multiplier, and replacing the multiplier in the copied cone by one of the multiplier implementations. The corresponding gate level cone (identified by the PCD) is unchanged. A new PCD is created to represent a pair check between each of the newly created cones and the corresponding gate level cone. The status of the original PCD is updated to represent a competitive check that refers to the new PCDs.

The competitive analysis illustrated above can be applied to any situation when it is possible to identify a portion of a cone and a list of suitable replacement portions that are known to be logically equivalent to the original portion. This information could be provided by the user (as in the case of the multiplier above), or the system could use information previously computed about pair checks that were shown EQUIVALENT to determine appropriate replacements.

As noted above, a preferred embodiment of the present invention relates to an equivalence checking system where two circuits are partitioned into a number of corresponding pair checks which are performed concurrently in a distributed computing environment. The creation of the circuit input, output and storage element correspondence is performed either with user guidance or using a known technology such as that described in the aforementioned Foster paper. The partitioning of the two circuits into corresponding combinational subcircuit pairs that contain no storage elements is performed using a known technology such as that described in the aforementioned paper by Foster. Each individual pair check is performed by using the combinational equivalence checking portion of a technology such as that described in U.S. Pat. No. 5,754,454 to Pixley et al,; van Eijk, "Formal Methods for the Verification of Digital Circuits", PhD. Thesis, Eindhoven.;Institute of Technology, Eindhoven, Netherlands (1997); van Eijk et al., "Exploiting Structural Similarities in a BDD-Based Verification Method", Proc. $2^{nd}$ International Conference on Theorem. Provers in Circuit Design, Lecture Notes in Computer Science, v. 901, pp. 110–125 (1995); or Burch et al., "Tight Integration of Combinational Verification Methods", International Conference on Computer-Aided Design, pp. 570–576 (1998). Each pair check returns a result that indicates whether the combinational pair is logically equivalent, logically not equivalent, or if the check was unable to determine a result with the allotted time and memory resources.

The term "input pair, output pair and storage element pair correspondence" refers to the correspondence described above and determined either with user guidance or using a known technology such as that described in the aforementioned paper by Foster.

The preferred embodiment includes a method to distribute the pair checks in a distributed computing environment, and to allow certain pair checks to be solved indirectly by a cooperative analysis, or a competitive analysis. A preferred embodiment of the present invention employs a single client application, referred to as the check manager, and a plurality of server applications, referred to as check engines. Four databases are used. A first database, referred to as the cone database, is used to store the representations of the two circuits and related data. Three further databases, referred to as the unchecked pool, the post-process pool and the finished pool, are used to store collections of PCDs. Each exists in at most one of the three pools at any given time.

Figure 3:
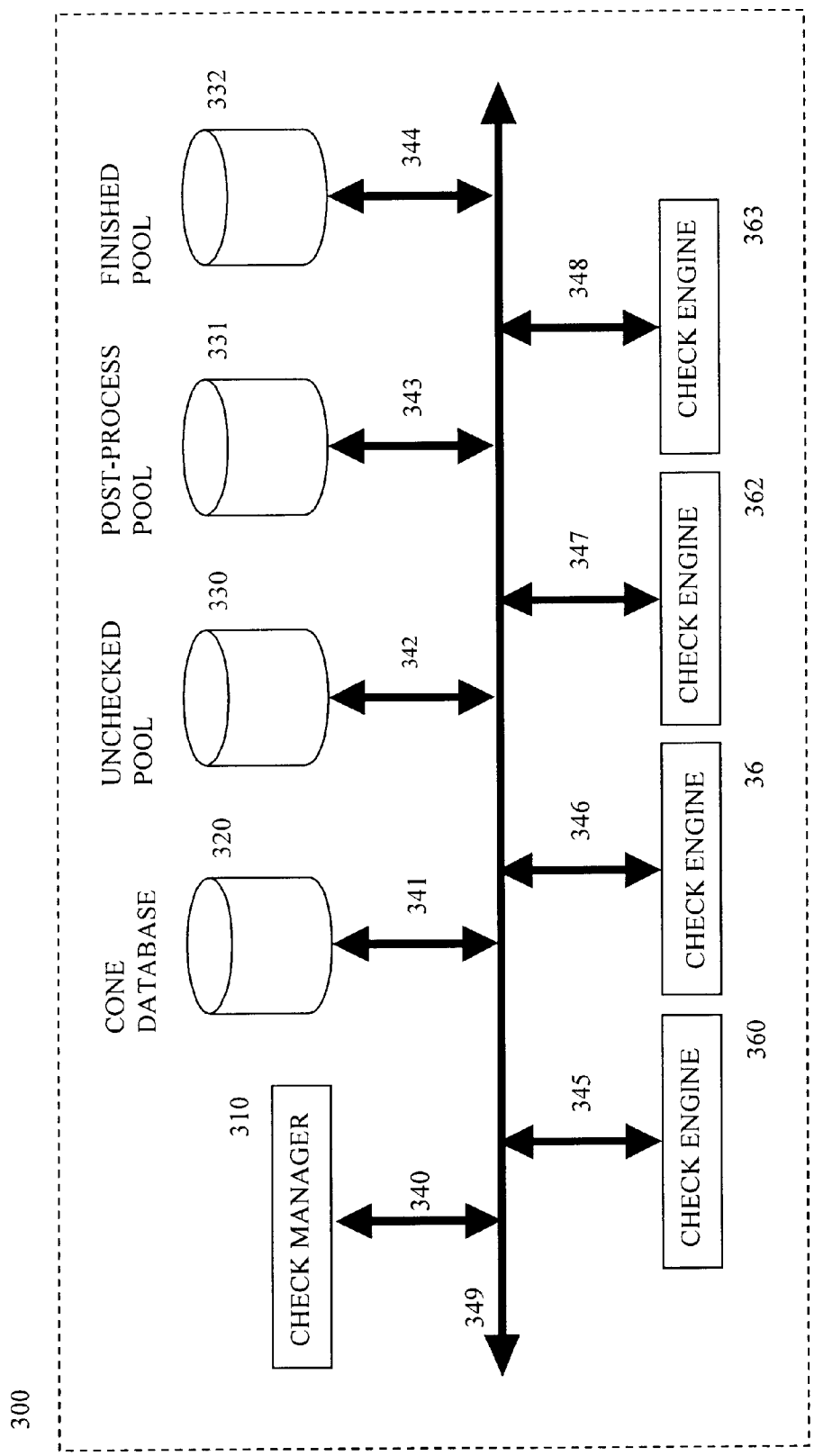
FIG. 3 illustrates, in block diagram form, the architecture of the new system for performing equivalence checks in a distributed computing environment.

FIG. 3 illustrates the architecture of the new system for performing equivalence checks in a distributed computing environment according to a preferred embodiment of the present invention. A network 340–349 provides a way for software applications on the computing units 310–332 and 360–363 to communicate. A check manager application resides on a computing unit 310. Check engine applications reside on computing units 360–363. A cone database management application resides on computing unit 320. Three databases, referred to as pools, are used to partially represent the current state of the equivalence check. An unchecked pool database application resides on computing unit 330. The unchecked pool contains a collection of PCDs 600 (see FIG. 6) that need to be checked by a check engine 360–363. A post-process pool database 331 application resides on computing unit 331. The post-process pool 331 contains a collection of PCDs 600 that have been checked by a check engine 360–363 and need further processing by the check manager 310. A finished pool database application resides on computing unit 332. The finished pool contains a collection of PCDs 600 that have been checked by a check engine 360–363 and require no further processing.

It should be understood that for simplicity, many standard items in a computing environment are omitted from FIGS. I and 3. These standard items include items such as CPU, RAM, ROM, keyboard, network communications interface, I/O adapter, etc.

For the purposes of clarity, each of the components 310–332 and 360–363 of the architecture is shown as residing on a separate computing unit. However, the assignment of components to computing units is arbitrary; for example, a number of components 310–332 and 360–363 may reside on the same computing unit. Additionally, although four check engines 360–363 are shown in the preferred embodiment, any number of check engines may be used and a large number of units is preferable to increase the computing power of the system.

The check manager 310 can read a description of the two circuits to be checked, and partitions the verification problem into a collection of pair checks. The check manager 310 can create PCDs 600 to represent a pair check, add a PCD 600 to a pool 330–332 and remove a PCD 600 from a pool 330–332. The check manager 310 can start a new check engine 360–363, request that a check engine 360–363 begin processing of an existing pair check, request that a check engine 360–363 halt processing of an existing pair check or terminate a check engine 360–363. A check engine 360–363 can add a PCD 600 to a pool 330–332, and remove a PCD 600 from a pool 330–332. The addition and removal of PCDs 600 to and from a pool 330–332 must be atomic to avoid problems when multiple applications attempt to access the same pool concurrently. Techniques to manage synchronization and mutual exclusivity in a distributed computing environment are well known in the art.

The unchecked pool 330 contains PCDs 600 representing pair checks that need to be verified by a check engine 360–363. The post-process pool 331 contains PCDs 600 representing pair checks that have been processed by a check engine 360–363, and that need further examination by the check manager 310. The finished pool 332 contains PCDs 600 representing pair checks that require no further action.

In some cases, described in greater detail below, the completion of one of a collection of related PCDs 600 obviates the need to perform checks on the other PCDs. To avoid performing unnecessary work, the check manager 310 can remove all other related PCDs 600 from the three pools 330–332. If a check engine 360–363 is currently processing one of the related PCDs 600, then the check manager may request the check engine 300–363 to halt processing. The check manager can use the parent PCD field 650 to determine the parent PCD, and can then use the parent PCD status field 630 to locate any other related PCDs.

The management and communication of shared data, and the management, scheduling and execution of concurrent computing jobs in a distributed computing environment are well known in the art. In particular, the techniques that enable the check manager or check engine to add and remove a PCD 600 to and from a pool 330–332 in an atomic manner are well known in the art. The atomic nature of the addition and removal of PCDs 600 to and from a pool ensures that at most one application (check manager or check engine) can acquire a given PCD 600, thus preventing any problems when multiple applications attempt to acquire a PCD 600 simultaneously. The JavaSpaces technology, described in Freeman et al., "JavaSpaces: Principles, Patterns and Practice", Addison Wesley, 1999, may be used for the implementation of the present invention. The JavaSpaces technology is a mechanism for performing tasks in a distributed computing environment. The JavaSpaces technology, based on the Java language, provides an associative distributed memory called tuple space, and operations WRITE, TAKE, and READ to write data, read and remove data and read data, respectively, from the tuple space in an atomic fashion. The JavaSpaces technology can be used to provide a mechanism to start and halt a distributed computing job.

The operation of the check engine 360–363 will first be described, followed by that of the check manager 310.

In the preferred embodiment, a check engine 360–363 performs any required initialization and then waits until the unchecked pool 330 contains a PCD 600 that has been placed there by the check manager 310. Then, the check engine 360–363 chooses a PCD 600 and removes it from the unchecked pool 330 to avoid replicated effort. Next, the check engine 360–363 retrieves the associated cone pair data from the cone database 320. Then, the system uses any appropriate equivalence checking method, such as those described in, e.g., the aforementioned documents, to determine if the combinational pair is equivalent. The equivalence checking method will return one of the following results: EQUIVALENT, NOT EQUIVALENT or INCOMPLETE. A status of EQUIVALENT or NOT EQUIVALENT indicates that the pair of cones referred to by the PCD 600 are functionally equivalent or not, respectively. If a status of NOT EQUIVALENT is returned, the equivalence checking method will also return a counterexample which demonstrates why the two cones are not functionally equivalent. A status of INCOMPLETE indicates that the allocated resources (time or memory) were exhausted before the method could determine a result. If a status of INCOMPLETE is returned, the equivalence checking method may also return a description of any interim computations and check engine state. This information may be used in future computations to avoid recomputing previously computed data.

Figure 5:
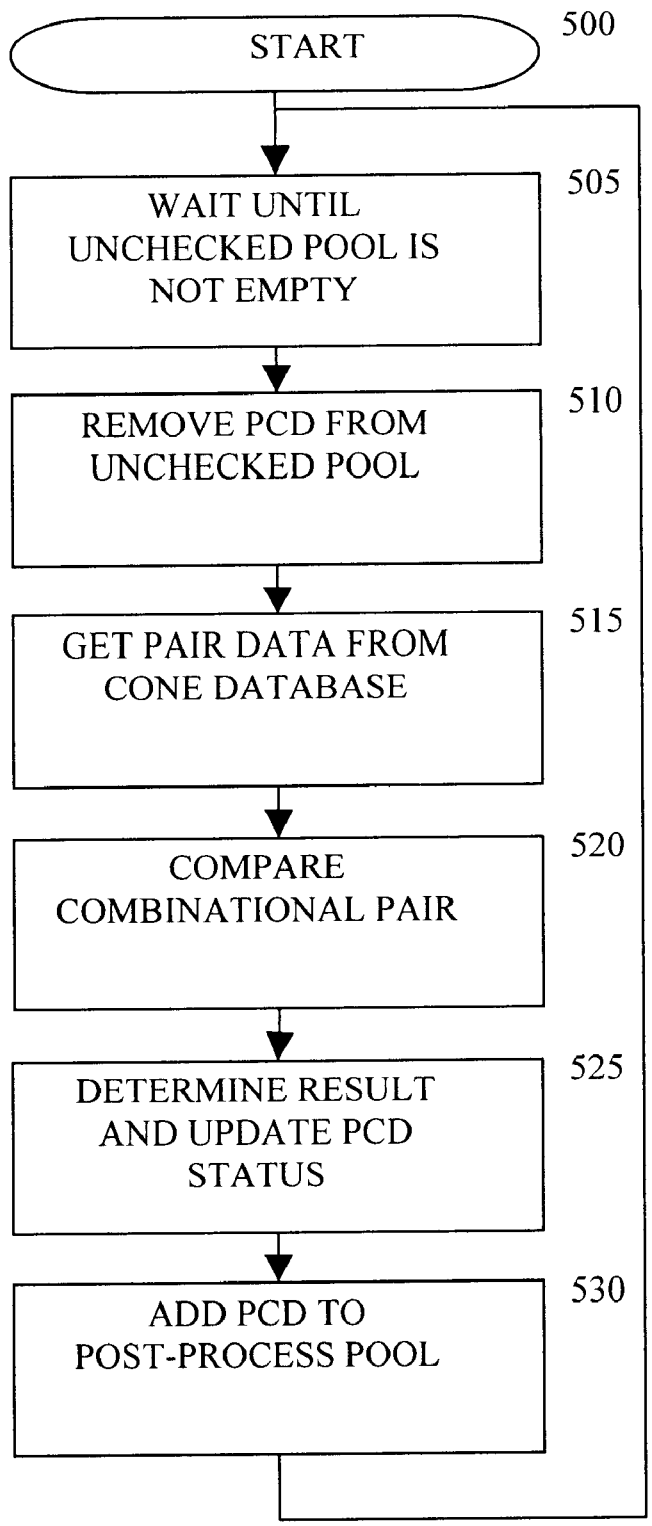
FIG. 5 illustrates, in flow diagram form, the method used by the check engine to determine if an assigned combinational pair is equivalent.

More specifically, FIG. 5 illustrates the method used by the check engine system 360–363 to determine if an assigned combinational pair is equivalent. A check engine 360–363 waits until the unchecked pool 330 is not empty in Step 505. Next, the check engine 360–363 removes a PCD 600 from the unchecked pool in Step 510. Next, the check engine 360–363 extracts the associated data from the cone database 320 in Step 515. Then, the check engine system 360–363 uses any appropriate method such as the ones described above to determine if the combinational pair is equivalent in Step 520.

After this, the system determines the check result and updates the PCD status 630 with one of the following values: EQUIVALENT, NOT EQUIVALENT or INCOMPLETE. An INCOMPLETE status indicates that the check engine 360–363 was unable to complete the pair check with the assigned resource limits, e.g., within given time and memory allotments. After this the check engine 360–363 adds the PCD 600 to the post-process pool 331 in Step 530 and it returns to wait for the unchecked pool 330 to become non-empty in Step 505. At any stage, the check manager 310 may request the check engine 360–363 to halt processing of the selected PCD 600. This may occur if the check manager can determine that the pair check referred to by the selected PCD 600 is unnecessary for the purposes of computing a result (this will elaborated below). If this occurs, the check engine 360–363 reinitializes itself and returns to Step 505 to wait for the unchecked pool 330 to become non-empty.

Figure 4:
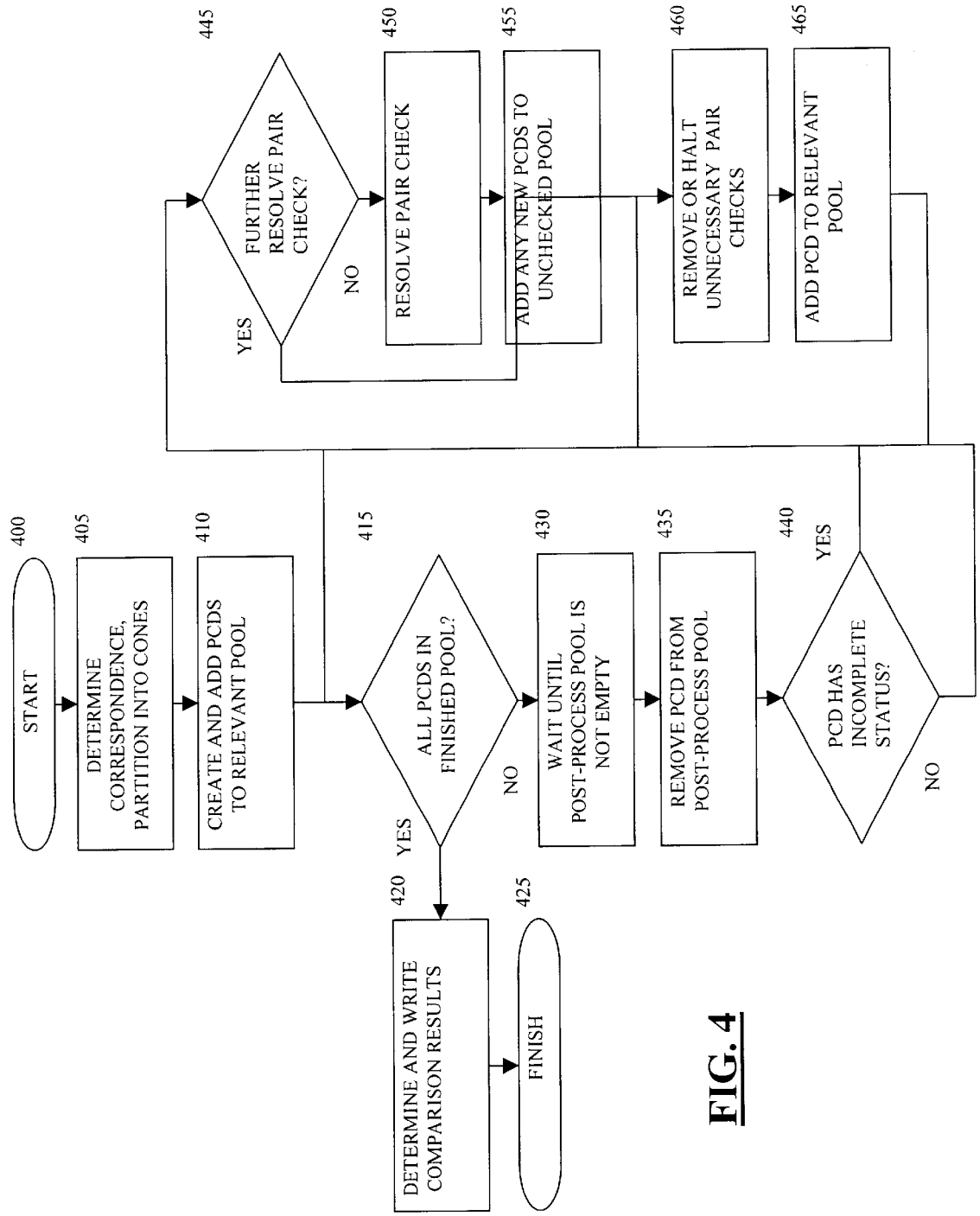
FIG. 4 illustrates, in flow diagram form, the method used by the check manager to control the check engines.

FIG. 4 illustrates the method used by the check manager system 310 to control the check engines 360–363 in the preferred embodiment. In the preferred embodiment, in Step 400 the check manager 310 reads in a description of the two circuits to be compared and stores representations of the two circuits and data associated with each pair check in the cone database 320. This data consists of a description of the combinational logic comprising each cone, including, but not limited to, the types of elementary gates and their interconnections and the names assigned to inputs, output and storage elements.

Preferably, all check engines 360–363 are initialized in Step 400. Next, the system determines the input pair, output pair and storage element pair correspondence in Step 405 either with user guidance or using a known technology such as that described in the aforementioned paper by Foster. The correspondence is used to partition of the two circuits into a collection of cones and corresponding pair checks that contain no storage elements. This partitioning is performed using a known technology such as that described in the aforementioned paper by Foster. Next, a PCD 600 is created for each pair check in Step 410. If a pair check is likely to be difficult, the system may decide to replace the pair check using cooperative or competitive replacement pair checks. The choice of using cooperative or competitive replacement pair checks will be discussed below. If cooperative or competitive replacement pair checks are used, a collection of additional pair checks is created, the original PCD status field 630 is updated appropriately and the original PCD 600 is placed into the finished pool 332 since no further processing is necessary. All other PCDs 600, including additional pair check PCDs 600 created as a result of competitive or cooperative analysis, are placed into the unchecked pool 330 in Step 410.

There are many possible policies that can be used to replace the pair check by cooperative or competitive replacement pair checks in Step 410. One simple policy would be to, e.g., only use competitive replacement pair checks to replace multipliers in RTL cones by one of a list of known multiplier implementations.

The check manager 310 determines if the verification is complete by checking if all PCDs 600 are in the finished pool 332 in Step 415. A PCD 600 that is not in the finished pool 332 is either in the unchecked pool 330, the post-process pool 331, or is being processed by a check engine 360–363.

If all pair checks have been completed, the check manager 310 can determine the overall status of the verification check by examining the PCDs 600 in the finished pool. This determination must take into account PCDs 600 that have a status value of COOPERATE or COMPETE, and all other PCDs whose parent PCD field 650 refer to these PCDs. In Step 420, the check manager 310 determines the overall verification status to be one of the following:

the designs are equivalent;

the designs are not equivalent; and the allocated resources were exhausted before the designs could be proven to be equivalent or not equivalent.

After determining the overall verification status, the check manager determines and writes out the comparison results in Step 420 and the system completes execution in Step 425. Preferably, all check engines 360–363 are terminated at this stage. One skilled in the art will readily appreciate that other policies are feasible, e.g., the check engines may be left running to perform a pair check associated with an unrelated equivalence checking problem.

If the verification is not complete, the check manager 310 waits until the postprocess pool 331 is not empty in Step 430. Then, the check manager 310 removes a PCD 600 from the post-process pool 331 in Step 435.

If the PCD 600 has a status value of INCOMPLETE in Step 440, then the system may decide to further resolve the corresponding pair check in Step 445. Many resolution policies are feasible:

A simple policy would be to never attempt further resolution.

Allocate additional time or memory resources to the pair check, up to some maximum limit. In this case, the PCD 600 status value is replaced by UNCHECKED, and the resource limit values are updated accordingly. For example, the amount of time and memory allocated to this PCD could be doubled. In this scenario it would be advantageous if some of the previous computations and state of the check engine 360–363 were saved, thus allowing a check engine 360–363 to avoid recomputing previously computed values.

Replace the INCOMPLETE pair check by cooperative replacement checks. For example, a simple case analysis could be performed on the pair check. Any cone input is selected, and two new pair checks and associated PCDs 600 are created by respectively assigning the selected input to the values 0 and 1. The new pair checks are assigned a status value of UNCHECKED, and the parent PCD field 530 assigned to the original PCD. The original PCD status value is replaced by COOPERATE, with references to the newly created PCDs 600. The original PCD will be moved to the finished pool 332 in Step 465. A complex case analysis can be performed in a similar manner.

Replace the INCOMPLETE pair check by competitive replacement checks. For example, a list of cones that are logically equivalent to one of the cones in the incomplete pair check is obtained. This list of equivalent cones could be provided by the user at the beginning of the equivalence check in Step 400, or the system could use previously computed information about pair checks that were determined EQUIVALENT to compute an appropriate list. To simplify the example, assume that the obtained list of cones is equivalent to the first cone of the PCD 600 (the roles of the first and second cone can be interchanged). A new PCD 600 is created for each element of the list of cones equivalent to the first cone. The output of the first cone of each new PCD 600 refers to the output of an element of this list, and the output of the second cone refers to the output of the second cone of the original PCD 600. The new pair checks are assigned a status value 630 of UNCHECKED, and the parent PCD field 650 assigned to the original PCD. The original PCD will be moved to the finished pool 332 in Step 465. The original PCD status value 630 is replaced by COMPETE, with references to the newly created PCDs 600.

A combination of the above policies.

If the system resolves a pair check, all newly created replacement checks are added to the unchecked pool 320 in Step 455.

Regardless of the PCD status or the decision to further resolve a pair check the system can remove or halt unnecessary pair checks in Step 460. A pair check may be rendered unnecessary by the result of a related pair check. For example, if a pair check is determined to have a status NOT EQUIVALENT, and the pair check is associated with a parent pair check with status value COOPERATE, then all other pair checks with the same parent pair check become unnecessary. This association can be determined by examining the parent PCD field 650 and the status field 630 of the parent PCD. Similar principles apply to competitive replacement checks. The unnecessary pair checks are removed from the unchecked pool 330 or the post-process pool 331. If a check engine 360–363 is performing an unnecessary pair check, then a request is sent to the check engine 360–363 to halt the current check. Next, the PCD 600 selected in Step 435 is added to the relevant pool 330–332 in Step 465. If the PCD 600 resource limits have been updated, the PCD 600 is returned to the unchecked pool, otherwise the PCD 600 is placed into the finished pool 332. Next, the system returns to Step 415 and repeats the process if necessary.

Figure 6:
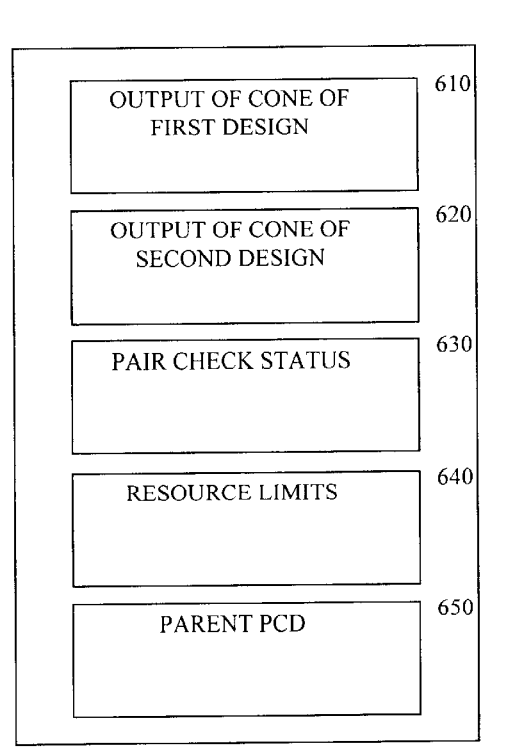
FIG. 6 illustrates, in block diagram form, the pair check descriptor data structure used to represent a combinational pair and the current status of the corresponding equivalence check.

FIG. 6 illustrates the PCD data structure 600 used to represent a combinational pair and the current status of the corresponding equivalence check. The PCD data structure 600 identifies the output 610 of the cone of the first design and output 620 of the cone of the second design, in the context of the cone database 320. The PCD data structure 600 identifies the current status of the pair check 630 and the resource limits 640 of the pair check. Examples of resource limits include maximum time and peak memory usage limits. The PCD data structure 600 contains a reference to any associated parent PCD 650.

Figure 7:
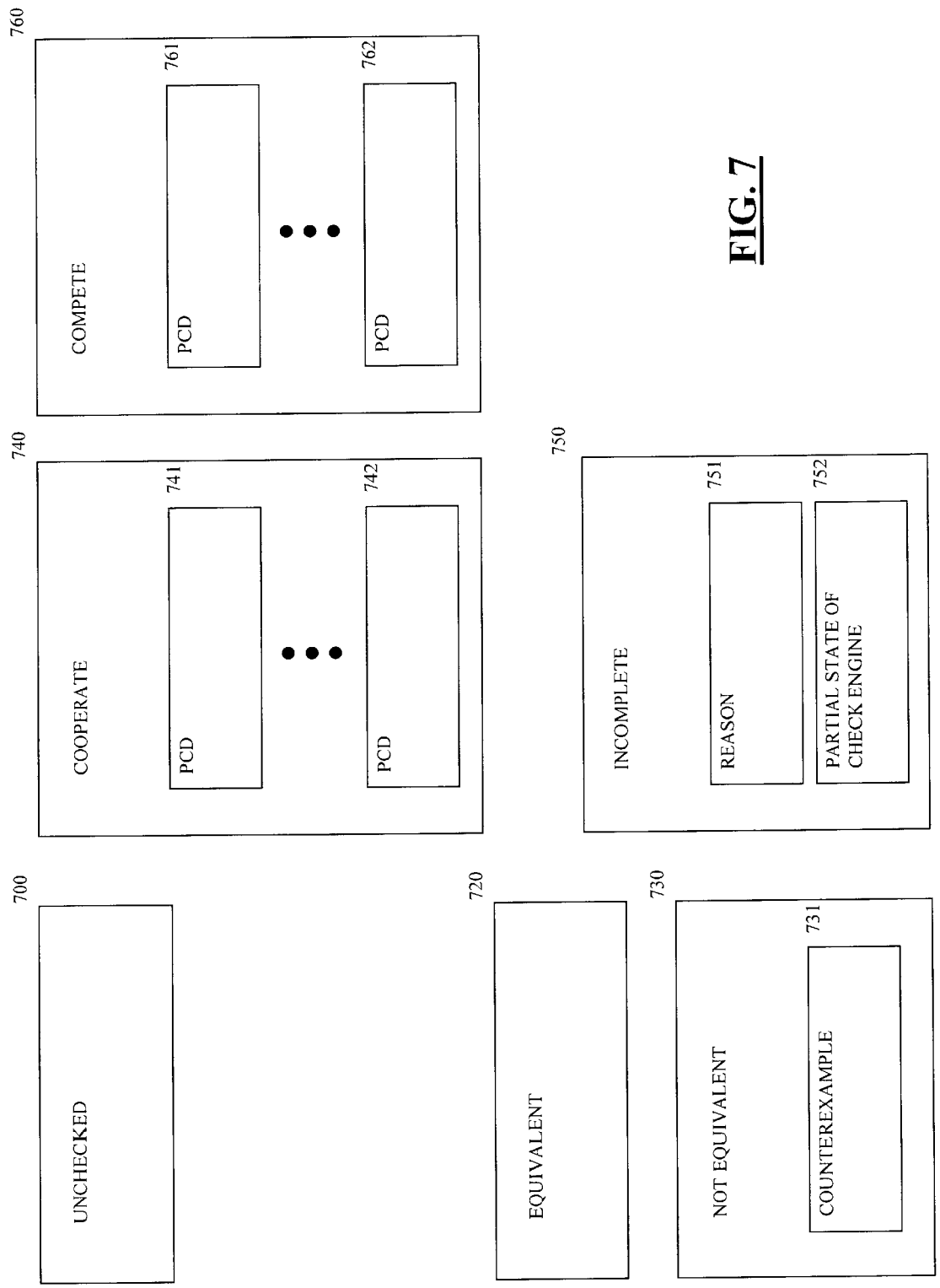
FIG. 7 illustrates, in block diagram form, the values that can be stored in the status field of the pair check descriptor data structure.

FIG. 7 illustrates the values that can be stored in the pair check status field 630 of the PCD data structure 600 of FIG. 6. The status field 630 indicates the current status of the corresponding combinational pair check. A status value 700 of UNCHECKED indicates that no attempt has been made to determine if the pair is equivalent. A status value 720 of EQUIVALENT indicates that a check engine 360–363 has determined the pair to be equivalent. A status value 730 of NOT EQUIVALENT indicates that a check engine 360–363 has determined the pair to be not equivalent, and includes a counterexample 731. The counterexample 731 can be used by the user to understand why the two cones are not logically equivalent.

A status value 750 of INCOMPLETE indicates that the check engine 360–363 was unable to make a determination with the assigned resource limits. The reason for the INCOMPLETE status is included in the PCD status field 751. This could indicate, e.g, that the computation could not complete with the allocated time or memory resources. A PCD status field 752 preferably includes a description of the check engine state, so that later recomputations can be avoided.

A status value 740 of COOPERATE indicates that the corresponding pair check has been replaced by a collection of pair checks identified by PCDs 741–742 (more than two PCDs may be included here). The collection of pair checks identified by PCDs 741–742 must be equivalent to the original pair check in the previously described manner.

A status value 760 of COMPETE indicates that the corresponding pair check has been replaced by a collection of pair checks identified by PCDs 761–762 (more than two PCDs may be included here). The collection of pair checks identified by PCDs 761–762 must be equivalent to the original pair check in the previously described manner.

Figure 8:
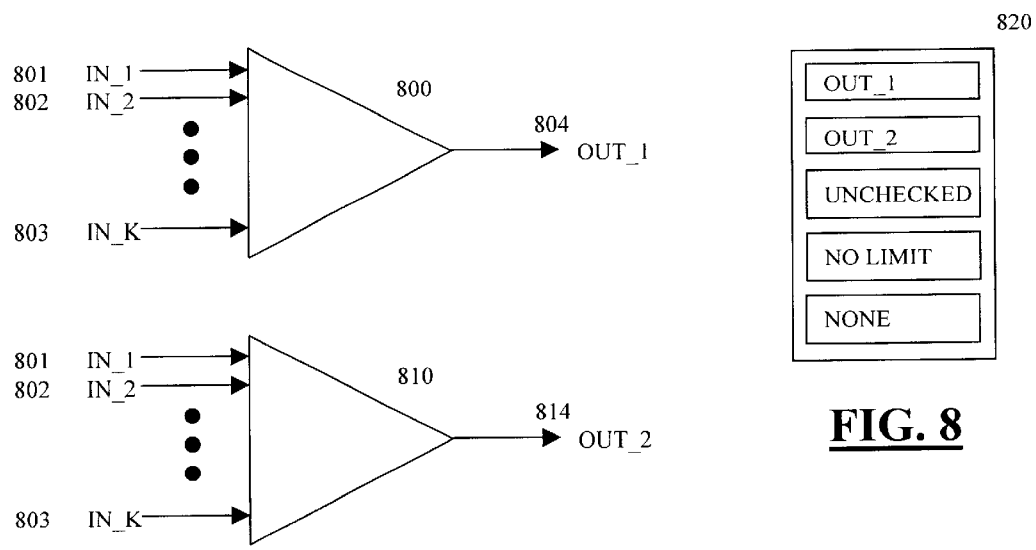
FIG. 8 illustrates, in block diagram form, an example of the data structures associated with a combinational pair check.

FIG. 8 illustrates an example of the data structures associated with a combinational pair check represented by a PCD 820, prior to an attempt to determine equivalence. Two cones of logic 800 and 810 share common inputs 801–803. The output of cone 800 is labeled OUT_1 804, and the output of cone 810 is labeled OUT_2 814. The corresponding PCD 820 represents a pair check between the outputs OUT_1 804 and OUT_2 814, with a status of UNCHECKED, and with no resource limits.

Figure 9:
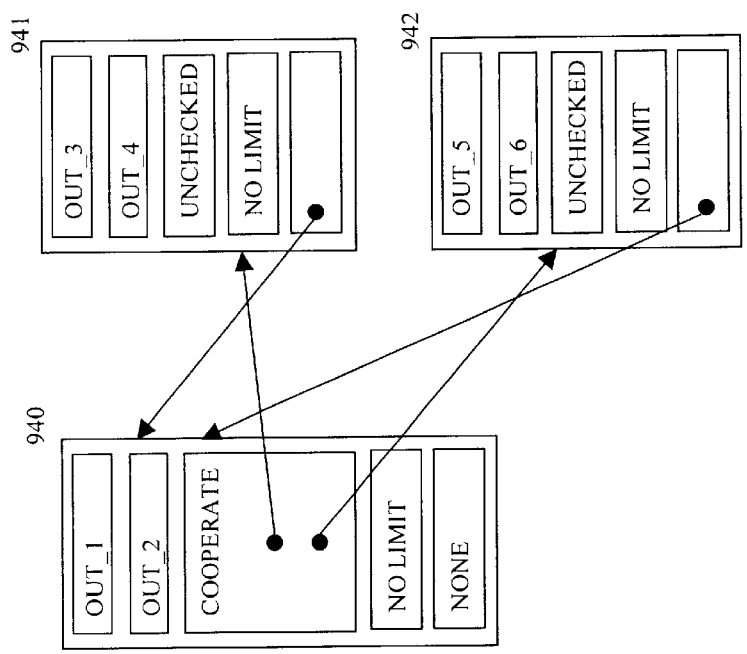
FIG. 9 illustrates, in block diagram form, an example of the data structures associated with a combinational pair that has been partitioned into two cooperating pair checks.
Figure 9:
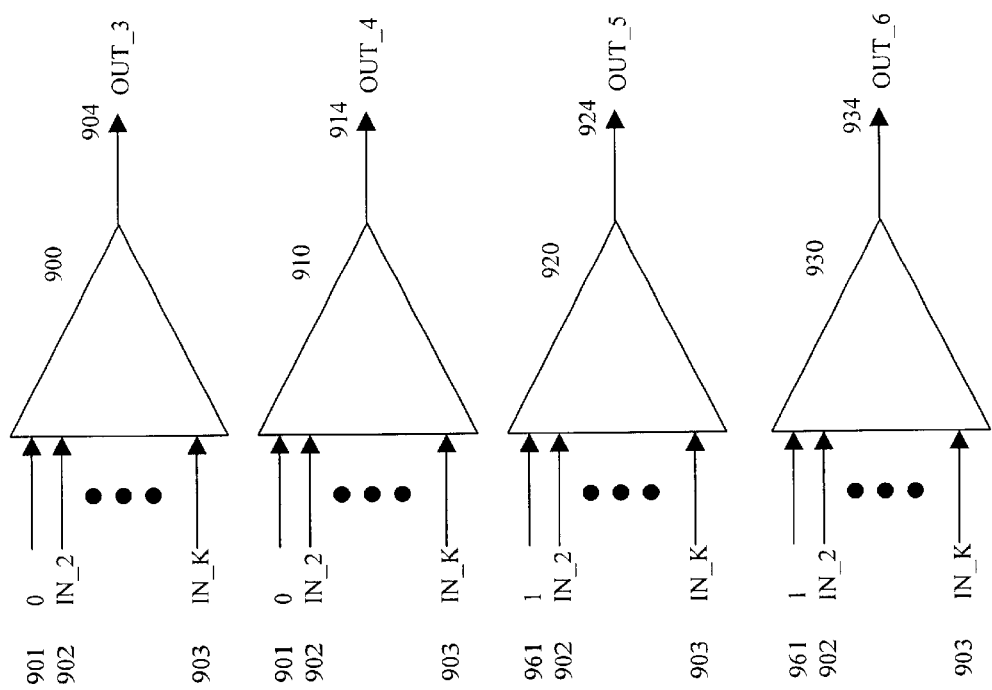

FIG. 9 illustrates an example of the PCDs 940–942 associated with a combinational pair that has been partitioned into two cooperating pair checks, prior to an attempt to determine equivalence. This example illustrates a simple case analysis applied to the example of FIG. 8, in which one of the inputs 901 is assigned to false (0) for one case (represented by cones 900 and 910), and assigned to true (1) for the other case (represented by cones 920 and 930). The logic cones 900 and 920 represent the same logic as cone 800. The logic cones 910 and 930 represent the same logic as cone 810. Four cones of logic 900–930 share common inputs 902–903. One input of cones 900 and 910 is assigned to the value false (0) 901, and one input of cones 920 and 930 is assigned to the value true (1) 961. The inputs 902–903 represent the same inputs as 802–803, respectively. The outputs of cones 900–930 are labeled OUT_3 904, OUT_4 914, OUT_5 924 and OUT_6 934 respectively. The corresponding PCD 940 represents a pair check between the outputs OUT_1 804 and OUT_2 814, with a status of COOPERATE. The COOPERATE status refers to two further PCDs 941 and 942. PCD 941 refers to the unchecked pair OUT_3 904 and OUT_4 914. PCD 942 refers to the unchecked pair OUT_5 924 and OUT_6 934.

Figure 10:
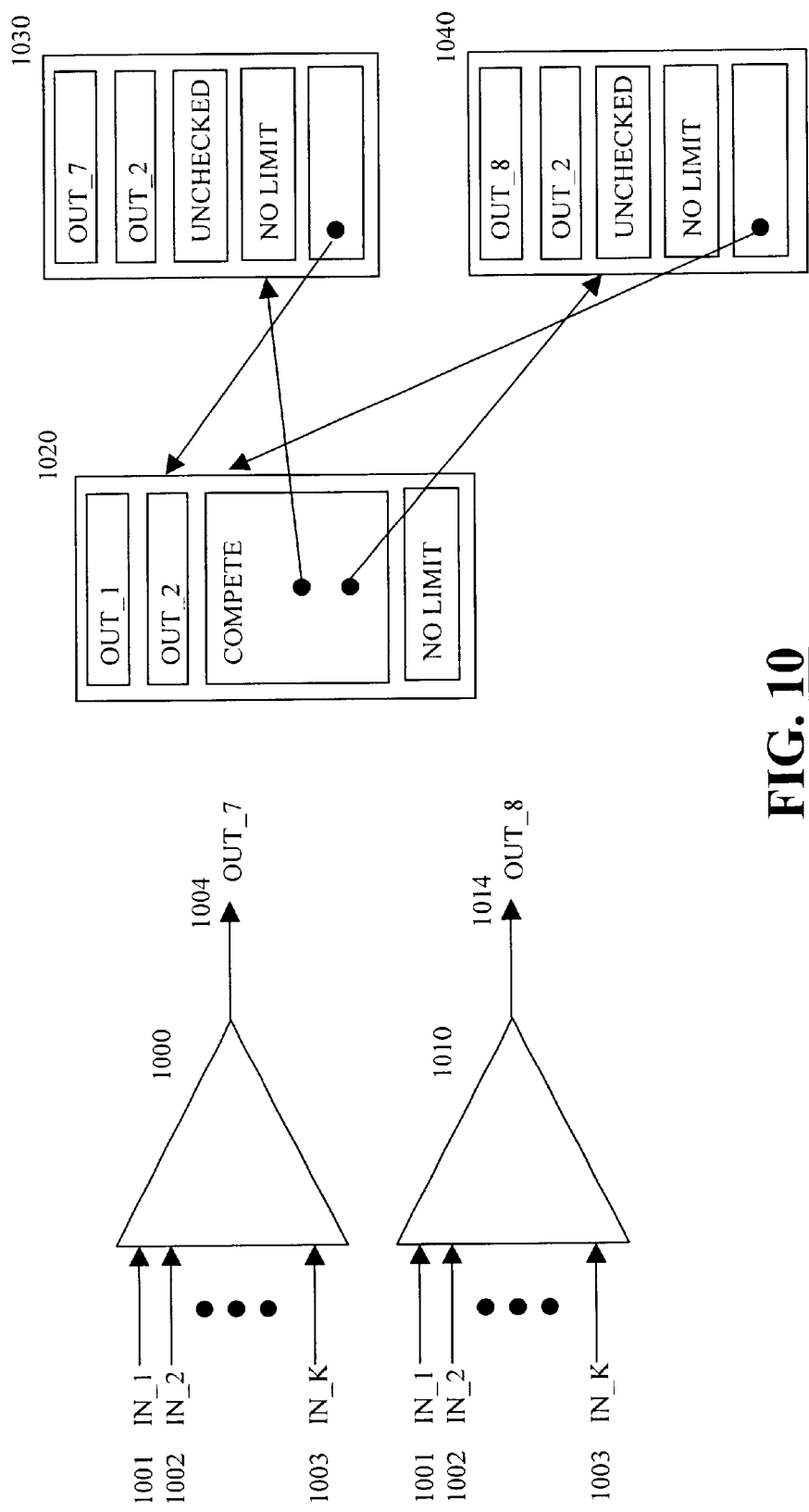
FIG. 10 illustrates, in block diagram form, an example of the data structures associated with a combinational pair that has been partitioned into two competing pair checks.

FIG. 10 illustrates an example of the PCDs 1020–1040 associated with a combinational pair that has been partitioned into two competing pair checks, prior to an attempt to determine equivalence. This example illustrates a competitive analysis applied to the example of FIG. 8. Two additional logic cones 1000 and 1010 have been introduced. In this example, the logic cones 1000 and 1010 are presumed to represent the same logical function (but not the same logic cone) as the logic cone 800. The inputs 1001–1003 represent the same inputs as 801–803 respectively. The outputs of cones 1000 and 1010 are labeled OUT_7 1004, OUT_8 1014 respectively. The corresponding PCD 1020 represents a pair check between the outputs OUT_1 804 and OUT_2 814, with a status of COMPETE. The COMPETE status refers to two further PCDs 1030 and 1040. PCD 1030 refers to the unchecked pair OUT_7 1004 and OUT_1 804. PCD 1040 refers to the unchecked pair OUT_8 1014 and OUT_2 814.

The methods and implementing apparatus of the present invention have been described in connection with the preferred embodiments as disclosed herein. Although exemplary embodiments of the present invention have been shown and described in detail herein, along with certain variants thereof, other varied embodiments which incorporate the teachings of the invention may easily be constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention. In other instances, well known structures are not shown in detail but can readily constructed by those skilled in the art.

What is claimed is:

1. A method for determining functional equivalence between circuit models, comprising:

partitioning two circuits models into a plurality of pairs of combinational logic cones and forming corresponding equivalence check stricture therefrom, each pair including a combinational logic cone from each of the two circuits;

assigning a plurality of the equivalence check structures to a plurality of check engines that check equivalence of pairs of combinational logic cones in the equivalence check structures;

determining when check engines of the plurality of check engines have finished checking equivalence of their assigned pairs of combinational logic cones in the equivalence check structures;

obtaining finished equivalence check results from the finished check engines;

determining when all of the plurality of check engines have finished checking equivalence of their assigned pairs of combinational logic cones in the equivalence check structures; and determining an overall equivalence check result based on all of the finished check engines' equivalence check results.

2. The method of claim 1, wherein all of the plurality of check engines execute on the same computer.

3. The method of claim 1, wherein each of the plurality of check engines executes on one of a plurality of computers.

4. The method of claim 1, further comprising:

identifying an equivalence check structure that is unnecessary for determining the overall equivalence check result; and removing that unnecessary equivalence check structure from consideration by the plurality of check engines.

5. The method of claim 1, further comprising:

replacing a first equivalence check by a plurality of cooperative replacement equivalence checks; and determining a result of the first equivalence check based on results of the plurality of cooperative replacement equivalence checks.

6. The method of claim 5, wherein the plurality of cooperative replacement equivalence checks are created by performing a case analysis based on a value of a node in at least one combinational logic cone.

7. The method of claim 5, wherein:

if at least one of the plurality of cooperative replacement equivalence checks is determined to be not equivalent then the first equivalent check is determined to be not equivalent; and if all of the plurality of cooperative replacement equivalence checks are determined to be equivalent then the first equivalent check is determined to be equivalent.

8. The method of claim 1, further comprising:

replacing a first equivalence check by a plurality of competing replacement equivalence checks; and determining a result of the first equivalence check based on results of the plurality of competing replacement equivalence checks.

9. The method of claim 8, wherein the plurality of competing replacement equivalence checks are created by replacing one or both combinational logic cones by different combinational logic cones known to be functionally equivalent to the cones they replace.

10. The method of claim 9, wherein a first combinational logic cone of the first equivalence check is known to represent a multiplier, and the plurality of competing replacement equivalence checks are created by replacing the first combinational logic cone with a collection of combinational logic cones representing different possible multiplier implementations.

11. The method of claim 8, wherein:

if at least one of the plurality of competing replacement equivalence checks is determined to be not equivalent then the first equivalent check is determined to be not equivalent; and if at least one of the plurality of competing replacement equivalence checks is determined to be equivalent then the first equivalent check is determined to be equivalent.

12. The method of claim 1, further comprising:

replacing a finished equivalence check which has a previously determined inconclusive result by an equivalent replacement equivalence check that has been allocated additional computing resources; and replacing the previously determined inconclusive result of the finished equivalence check with the result of the equivalent replacement equivalence check.

13. The method of claim 12, further comprising:

saving data computed by a first check engine while performing a first equivalence check in which the first check engine determines an inconclusive result; and restoring the saved data associated with the first equivalence check if the first equivalence check is allocated additional computing resources.

14. The method of claim 1, further comprising:

replacing a first equivalence check by an equivalent replacement equivalence check in which a portion of one or both combinational logic cones is replaced by a different combinational logic cone known to be functionally equivalent; and replacing a result of the first equivalence check by the result of the equivalent replacement equivalence check.

15. The method of claim 1, further comprising:

saving data computed by a first check engine while performing a first equivalence check in which the first check engine determines an inconclusive result; and restoring the saved data associated with the first equivalence check if the first equivalence check is allocated additional computing resources.

16. The method of claim 15, further comprising:

replacing the first equivalence check by an equivalent replacement equivalence check that has been allocated additional computing resources; and replacing the inconclusive result of the first equivalence check with the result of the equivalent replacement equivalence check.

* * * * *